United States Patent
Nicholls et al.

(10) Patent No.: US 9,141,177 B1
(45) Date of Patent: Sep. 22, 2015

(54) DATA STORAGE DEVICE EMPLOYING GLITCH COMPENSATION FOR POWER LOSS DETECTION

(71) Applicant: Western Digital Technologies, Inc., Irvine, CA (US)

(72) Inventors: Michael T. Nicholls, Laguna Hills, CA (US); Robert P. Ryan, Mission Viejo, CA (US)

(73) Assignee: Western Digital Technologies, Inc., Irvine, CA (US)

(*) Notice: Subject to any disclaimer, the term of this patent is extended or adjusted under 35 U.S.C. 154(b) by 0 days.

(21) Appl. No.: 14/289,413

(22) Filed: May 28, 2014

Related U.S. Application Data

(63) Continuation-in-part of application No. 14/260,426, filed on Apr. 24, 2014.

(60) Provisional application No. 61/968,841, filed on Mar. 21, 2014.

(51) Int. Cl.
*G11C 5/14* (2006.01)
*G06F 1/32* (2006.01)

(52) U.S. Cl.
CPC ............ *G06F 1/3268* (2013.01); *G06F 1/3296* (2013.01)

(58) Field of Classification Search
CPC .......... G11C 5/141; G11C 5/143; G11C 5/14; G11C 5/04; G11C 5/147; G11C 16/12; G11C 5/148; G11C 7/24; G11C 11/4074; G11C 14/0036; G11C 14/0081
See application file for complete search history.

(56) References Cited

U.S. PATENT DOCUMENTS

| | | |
|---|---|---|
| 4,375,663 A | 3/1983 | Arcara et al. |
| 5,196,833 A | 3/1993 | Kemp |
| 5,198,942 A | 3/1993 | Iizuka et al. |
| 5,283,792 A | 2/1994 | Davies, Jr. et al. |
| 6,014,283 A | 1/2000 | Codilian et al. |
| 6,052,076 A | 4/2000 | Patton, III et al. |
| 6,052,250 A | 4/2000 | Golowka et al. |
| 6,067,206 A | 5/2000 | Hull et al. |
| 6,078,453 A | 6/2000 | Dziallo et al. |
| 6,091,564 A | 7/2000 | Codilian et al. |
| 6,094,020 A | 7/2000 | Goretzki et al. |
| 6,101,065 A | 8/2000 | Alfred et al. |
| 6,104,153 A | 8/2000 | Codilian et al. |
| 6,122,133 A | 9/2000 | Nazarian et al. |
| 6,122,135 A | 9/2000 | Stich |
| 6,141,175 A | 10/2000 | Nazarian et al. |
| 6,160,368 A | 12/2000 | Plutowski |
| 6,181,502 B1 | 1/2001 | Hussein et al. |
| 6,195,222 B1 | 2/2001 | Heminger et al. |

(Continued)

FOREIGN PATENT DOCUMENTS

WO 2008061566 A1 5/2008

OTHER PUBLICATIONS

Michael T. Nicholls, et al., U.S. Appl. No. 14/260,426, filed Apr. 24, 2014, 20 pages.

*Primary Examiner* — Hien Nguyen

(57) ABSTRACT

A data storage device is disclosed comprising a non-volatile memory powered by a supply voltage. The supply voltage is compared to a power loss threshold, and when the supply voltage falls below the power loss threshold, a power loss event is detected and an emergency operation is executed. The power loss threshold is decreased, and after an interval the power loss threshold is increased.

20 Claims, 12 Drawing Sheets

(56) References Cited

U.S. PATENT DOCUMENTS

| | | |
|---|---|---|
| 6,198,584 B1 | 3/2001 | Codilian et al. |
| 6,198,590 B1 | 3/2001 | Codilian et al. |
| 6,204,988 B1 | 3/2001 | Codilian et al. |
| 6,243,223 B1 | 6/2001 | Elliott et al. |
| 6,281,652 B1 | 8/2001 | Ryan et al. |
| 6,285,521 B1 | 9/2001 | Hussein |
| 6,292,320 B1 | 9/2001 | Mason et al. |
| 6,310,742 B1 | 10/2001 | Nazarian et al. |
| 6,320,718 B1 | 11/2001 | Bouwkamp et al. |
| 6,342,984 B1 | 1/2002 | Hussein et al. |
| 6,347,018 B1 | 2/2002 | Kadlec et al. |
| 6,369,972 B1 | 4/2002 | Codilian et al. |
| 6,369,974 B1 | 4/2002 | Asgari |
| 6,462,896 B1 | 10/2002 | Codilian et al. |
| 6,476,996 B1 | 11/2002 | Ryan |
| 6,484,577 B1 | 11/2002 | Bennett |
| 6,493,169 B1 | 12/2002 | Ferris et al. |
| 6,496,324 B1 | 12/2002 | Golowka et al. |
| 6,498,698 B1 | 12/2002 | Golowka et al. |
| 6,507,450 B1 | 1/2003 | Elliott |
| 6,534,936 B2 | 3/2003 | Messenger et al. |
| 6,538,839 B1 | 3/2003 | Ryan |
| 6,545,835 B1 | 4/2003 | Codilian et al. |
| 6,549,359 B1 | 4/2003 | Bennett et al. |
| 6,549,361 B1 | 4/2003 | Bennett et al. |
| 6,560,056 B1 | 5/2003 | Ryan |
| 6,568,268 B1 | 5/2003 | Bennett |
| 6,574,062 B1 | 6/2003 | Bennett et al. |
| 6,577,465 B1 | 6/2003 | Bennett et al. |
| 6,614,615 B1 | 9/2003 | Ju et al. |
| 6,614,618 B1 | 9/2003 | Sheh et al. |
| 6,636,377 B1 | 10/2003 | Yu et al. |
| 6,690,536 B1 | 2/2004 | Ryan |
| 6,693,764 B1 | 2/2004 | Sheh et al. |
| 6,707,635 B1 | 3/2004 | Codilian et al. |
| 6,710,953 B1 | 3/2004 | Vallis et al. |
| 6,710,966 B1 | 3/2004 | Codilian et al. |
| 6,714,371 B1 | 3/2004 | Codilian |
| 6,714,372 B1 | 3/2004 | Codilian et al. |
| 6,724,564 B1 | 4/2004 | Codilian et al. |
| 6,731,450 B1 | 5/2004 | Codilian et al. |
| 6,735,041 B1 | 5/2004 | Codilian et al. |
| 6,738,220 B1 | 5/2004 | Codilian |
| 6,747,837 B1 | 6/2004 | Bennett |
| 6,760,186 B1 | 7/2004 | Codilian et al. |
| 6,788,483 B1 | 9/2004 | Ferris et al. |
| 6,791,785 B1 | 9/2004 | Messenger et al. |
| 6,795,268 B1 | 9/2004 | Ryan |
| 6,819,518 B1 | 11/2004 | Melkote et al. |
| 6,826,006 B1 | 11/2004 | Melkote et al. |
| 6,826,007 B1 | 11/2004 | Patton, III |
| 6,847,502 B1 | 1/2005 | Codilian |
| 6,850,383 B1 | 2/2005 | Bennett |
| 6,850,384 B1 | 2/2005 | Bennett |
| 6,867,944 B1 | 3/2005 | Ryan |
| 6,876,508 B1 | 4/2005 | Patton, III et al. |
| 6,882,496 B1 | 4/2005 | Codilian et al. |
| 6,885,514 B1 | 4/2005 | Codilian et al. |
| 6,900,958 B1 | 5/2005 | Yi et al. |
| 6,900,959 B1 | 5/2005 | Gardner et al. |
| 6,903,897 B1 | 6/2005 | Wang et al. |
| 6,914,740 B1 | 7/2005 | Tu et al. |
| 6,914,743 B1 | 7/2005 | Narayana et al. |
| 6,920,004 B1 | 7/2005 | Codilian et al. |
| 6,924,959 B1 | 8/2005 | Melkote et al. |
| 6,924,960 B1 | 8/2005 | Melkote et al. |
| 6,924,961 B1 | 8/2005 | Melkote et al. |
| 6,934,114 B1 | 8/2005 | Codilian et al. |
| 6,934,135 B1 | 8/2005 | Ryan |
| 6,937,420 B1 | 8/2005 | McNab et al. |
| 6,937,423 B1 | 8/2005 | Ngo et al. |
| 6,952,322 B1 | 10/2005 | Codilian et al. |
| 6,954,324 B1 | 10/2005 | Tu et al. |
| 6,958,881 B1 | 10/2005 | Codilian et al. |
| 6,963,465 B1 | 11/2005 | Melkote et al. |
| 6,965,488 B1 | 11/2005 | Bennett |
| 6,967,458 B1 | 11/2005 | Bennett et al. |
| 6,967,811 B1 | 11/2005 | Codilian et al. |
| 6,970,319 B1 | 11/2005 | Bennett et al. |
| 6,972,539 B1 | 12/2005 | Codilian et al. |
| 6,972,540 B1 | 12/2005 | Wang et al. |
| 6,972,922 B1 | 12/2005 | Subrahmanyam et al. |
| 6,975,480 B1 | 12/2005 | Codilian et al. |
| 6,977,789 B1 | 12/2005 | Cloke |
| 6,980,389 B1 | 12/2005 | Kupferman |
| 6,987,636 B1 | 1/2006 | Chue et al. |
| 6,987,639 B1 | 1/2006 | Yu |
| 6,989,954 B1 | 1/2006 | Lee et al. |
| 6,992,848 B1 | 1/2006 | Agarwal et al. |
| 6,992,851 B1 | 1/2006 | Cloke |
| 6,992,852 B1 | 1/2006 | Ying et al. |
| 6,995,941 B1 | 2/2006 | Miyamura et al. |
| 6,999,263 B1 | 2/2006 | Melkote et al. |
| 6,999,267 B1 | 2/2006 | Melkote et al. |
| 7,006,320 B1 | 2/2006 | Bennett et al. |
| 7,016,134 B1 | 3/2006 | Agarwal et al. |
| 7,023,637 B1 | 4/2006 | Kupferman |
| 7,023,640 B1 | 4/2006 | Codilian et al. |
| 7,027,256 B1 | 4/2006 | Subrahmanyam et al. |
| 7,027,257 B1 | 4/2006 | Kupferman |
| 7,035,026 B2 | 4/2006 | Codilian et al. |
| 7,046,472 B1 | 5/2006 | Melkote et al. |
| 7,050,249 B1 | 5/2006 | Chue et al. |
| 7,050,254 B1 | 5/2006 | Yu et al. |
| 7,050,258 B1 | 5/2006 | Codilian |
| 7,054,098 B1 | 5/2006 | Yu et al. |
| 7,061,714 B1 | 6/2006 | Yu |
| 7,064,918 B1 | 6/2006 | Codilian et al. |
| 7,068,451 B1 | 6/2006 | Wang et al. |
| 7,068,459 B1 | 6/2006 | Cloke et al. |
| 7,068,461 B1 | 6/2006 | Chue et al. |
| 7,068,463 B1 | 6/2006 | Ji et al. |
| 7,088,547 B1 | 8/2006 | Wang et al. |
| 7,095,579 B1 | 8/2006 | Ryan et al. |
| 7,110,208 B1 | 9/2006 | Miyamura et al. |
| 7,110,214 B1 | 9/2006 | Tu et al. |
| 7,113,362 B1 | 9/2006 | Lee et al. |
| 7,113,365 B1 | 9/2006 | Ryan et al. |
| 7,116,505 B1 | 10/2006 | Kupferman |
| 7,126,781 B1 | 10/2006 | Bennett |
| 7,158,329 B1 | 1/2007 | Ryan |
| 7,180,703 B1 | 2/2007 | Subrahmanyam et al. |
| 7,184,230 B1 | 2/2007 | Chue et al. |
| 7,196,864 B1 | 3/2007 | Yi et al. |
| 7,199,966 B1 | 4/2007 | Tu et al. |
| 7,203,021 B1 | 4/2007 | Ryan et al. |
| 7,209,321 B1 | 4/2007 | Bennett |
| 7,212,364 B1 | 5/2007 | Lee |
| 7,212,374 B1 | 5/2007 | Wang et al |
| 7,215,504 B1 | 5/2007 | Bennett |
| 7,224,546 B1 | 5/2007 | Orakcilar et al. |
| 7,248,426 B1 | 7/2007 | Weerasooriya et al. |
| 7,251,098 B1 | 7/2007 | Wang et al. |
| 7,253,582 B1 | 8/2007 | Ding et al. |
| 7,253,989 B1 | 8/2007 | Lau et al. |
| 7,265,933 B1 | 9/2007 | Phan et al. |
| 7,289,288 B1 | 10/2007 | Tu |
| 7,293,188 B2 | 11/2007 | Espinor et al. |
| 7,298,574 B1 | 11/2007 | Melkote et al. |
| 7,301,717 B1 | 11/2007 | Lee et al. |
| 7,304,819 B1 | 12/2007 | Melkote et al. |
| 7,330,019 B1 | 2/2008 | Bennett |
| 7,330,327 B1 | 2/2008 | Chue et al. |
| 7,333,280 B1 | 2/2008 | Lifchits et al. |
| 7,333,290 B1 | 2/2008 | Kupferman |
| 7,339,761 B1 | 3/2008 | Tu et al. |
| 7,365,932 B1 | 4/2008 | Bennett |
| 7,388,728 B1 | 6/2008 | Chen et al. |
| 7,391,583 B1 | 6/2008 | Sheh et al. |
| 7,391,584 B1 | 6/2008 | Sheh et al. |
| 7,433,143 B1 | 10/2008 | Ying et al. |
| 7,440,210 B1 | 10/2008 | Lee |
| 7,440,225 B1 | 10/2008 | Chen et al. |
| 7,450,334 B1 | 11/2008 | Wang et al. |

(56) References Cited

U.S. PATENT DOCUMENTS

| | | |
|---|---|---|
| 7,450,336 B1 | 11/2008 | Wang et al. |
| 7,453,661 B1 | 11/2008 | Jang et al. |
| 7,457,071 B1 | 11/2008 | Sheh |
| 7,466,509 B1 | 12/2008 | Chen et al. |
| 7,468,855 B1 | 12/2008 | Weerasooriya et al. |
| 7,477,471 B1 | 1/2009 | Nemshick et al. |
| 7,480,116 B1 | 1/2009 | Bennett |
| 7,489,464 B1 | 2/2009 | McNab et al. |
| 7,492,546 B1 | 2/2009 | Miyamura |
| 7,495,857 B1 | 2/2009 | Bennett |
| 7,499,236 B1 | 3/2009 | Lee et al. |
| 7,502,192 B1 | 3/2009 | Wang et al. |
| 7,502,195 B1 | 3/2009 | Wu et al. |
| 7,502,197 B1 | 3/2009 | Chue |
| 7,505,223 B1 | 3/2009 | McCornack |
| 7,525,353 B2 | 4/2009 | Wadhwa et al. |
| 7,542,225 B1 | 6/2009 | Ding et al. |
| 7,548,392 B1 | 6/2009 | Desai et al. |
| 7,551,390 B1 | 6/2009 | Wang et al. |
| 7,558,016 B1 | 7/2009 | Le et al. |
| 7,568,117 B1 | 7/2009 | Fernald |
| 7,573,670 B1 | 8/2009 | Ryan et al. |
| 7,576,941 B1 | 8/2009 | Chen et al. |
| 7,580,212 B1 | 8/2009 | Li et al. |
| 7,583,470 B1 | 9/2009 | Chen et al. |
| 7,595,954 B1 | 9/2009 | Chen et al. |
| 7,602,575 B1 | 10/2009 | Lifchits et al. |
| 7,616,399 B1 | 11/2009 | Chen et al. |
| 7,619,844 B1 | 11/2009 | Bennett |
| 7,626,782 B1 | 12/2009 | Yu et al. |
| 7,630,162 B2 | 12/2009 | Zhao et al. |
| 7,639,447 B1 | 12/2009 | Yu et al. |
| 7,656,604 B1 | 2/2010 | Liang et al. |
| 7,656,607 B1 | 2/2010 | Bennett |
| 7,660,067 B1 | 2/2010 | Ji et al. |
| 7,663,835 B1 | 2/2010 | Yu et al. |
| 7,675,707 B1 | 3/2010 | Liu et al. |
| 7,679,854 B1 | 3/2010 | Narayana et al. |
| 7,688,534 B1 | 3/2010 | McCornack |
| 7,688,538 B1 | 3/2010 | Chen et al. |
| 7,688,539 B1 | 3/2010 | Bryant et al. |
| 7,697,233 B1 | 4/2010 | Bennett et al. |
| 7,701,661 B1 | 4/2010 | Bennett |
| 7,710,676 B1 | 5/2010 | Chue |
| 7,715,138 B1 | 5/2010 | Kupferman |
| 7,729,079 B1 | 6/2010 | Huber |
| 7,733,189 B1 | 6/2010 | Bennett |
| 7,746,592 B1 | 6/2010 | Liang et al. |
| 7,746,594 B1 | 6/2010 | Guo et al. |
| 7,746,595 B1 | 6/2010 | Guo et al. |
| 7,760,461 B1 | 7/2010 | Bennett |
| 7,800,853 B1 | 9/2010 | Guo et al. |
| 7,800,856 B1 | 9/2010 | Bennett et al. |
| 7,800,857 B1 | 9/2010 | Calaway et al. |
| 7,839,591 B1 | 11/2010 | Weerasooriya et al. |
| 7,839,595 B1 | 11/2010 | Chue et al. |
| 7,839,600 B1 | 11/2010 | Babinski et al. |
| 7,843,662 B1 | 11/2010 | Weerasooriya et al. |
| 7,852,588 B1 | 12/2010 | Ferris et al. |
| 7,852,592 B1 | 12/2010 | Liang et al. |
| 7,864,481 B1 | 1/2011 | Kon et al. |
| 7,864,482 B1 | 1/2011 | Babinski et al. |
| 7,869,155 B1 | 1/2011 | Wong |
| 7,876,522 B1 | 1/2011 | Calaway et al. |
| 7,876,523 B1 | 1/2011 | Panyavoravaj et al. |
| 7,916,415 B1 | 3/2011 | Chue |
| 7,916,416 B1 | 3/2011 | Guo et al. |
| 7,916,420 B1 | 3/2011 | McFadyen et al. |
| 7,916,422 B1 | 3/2011 | Guo et al. |
| 7,929,238 B1 | 4/2011 | Vasquez |
| 7,961,422 B1 | 6/2011 | Chen et al. |
| 8,000,053 B1 | 8/2011 | Anderson |
| 8,031,423 B1 | 10/2011 | Tsai et al. |
| 8,054,022 B1 | 11/2011 | Ryan et al. |
| 8,059,357 B1 | 11/2011 | Knigge et al. |
| 8,059,360 B1 | 11/2011 | Melkote et al. |
| 8,072,703 B1 | 12/2011 | Calaway et al. |
| 8,077,428 B1 | 12/2011 | Chen et al. |
| 8,078,901 B1 | 12/2011 | Meyer et al. |
| 8,081,395 B1 | 12/2011 | Ferris |
| 8,085,020 B1 | 12/2011 | Bennett |
| 8,116,023 B1 | 2/2012 | Kupferman |
| 8,145,934 B1 | 3/2012 | Ferris et al. |
| 8,179,626 B1 | 5/2012 | Ryan et al. |
| 8,189,286 B1 | 5/2012 | Chen et al. |
| 8,213,106 B1 | 7/2012 | Guo et al. |
| 8,214,165 B2 | 7/2012 | Dishman et al. |
| 8,254,222 B1 | 8/2012 | Tang |
| 8,300,348 B1 | 10/2012 | Liu et al. |
| 8,315,005 B1 | 11/2012 | Zou et al. |
| 8,320,069 B1 | 11/2012 | Knigge et al. |
| 8,330,526 B2 | 12/2012 | Vilas Boas et al. |
| 8,351,174 B1 | 1/2013 | Gardner et al. |
| 8,358,114 B1 | 1/2013 | Ferris et al. |
| 8,358,145 B1 | 1/2013 | Ferris et al. |
| 8,390,367 B1 | 3/2013 | Bennett |
| 8,432,031 B1 | 4/2013 | Agness et al. |
| 8,432,629 B1 | 4/2013 | Rigney et al. |
| 8,451,697 B1 | 5/2013 | Rigney et al. |
| 8,482,873 B1 | 7/2013 | Chue et al. |
| 8,498,076 B1 | 7/2013 | Sheh et al. |
| 8,498,172 B1 | 7/2013 | Patton, III et al. |
| 8,508,881 B1 | 8/2013 | Babinski et al. |
| 8,531,798 B1 | 9/2013 | Xi et al. |
| 8,537,486 B2 | 9/2013 | Liang et al. |
| 8,542,455 B2 | 9/2013 | Huang et al. |
| 8,553,351 B1 | 10/2013 | Narayana et al. |
| 8,564,899 B2 | 10/2013 | Lou et al. |
| 8,576,506 B1 | 11/2013 | Wang et al. |
| 8,605,382 B1 | 12/2013 | Mallary et al. |
| 8,605,384 B1 | 12/2013 | Liu et al. |
| 8,610,391 B1 | 12/2013 | Yang et al. |
| 8,611,040 B1 | 12/2013 | Xi et al. |
| 8,619,385 B1 | 12/2013 | Guo et al. |
| 8,630,054 B2 | 1/2014 | Bennett et al. |
| 8,630,059 B1 | 1/2014 | Chen et al. |
| 8,634,154 B1 | 1/2014 | Rigney et al. |
| 8,634,283 B1 | 1/2014 | Rigney et al. |
| 8,643,976 B1 | 2/2014 | Wang et al. |
| 8,649,121 B1 | 2/2014 | Smith et al. |
| 8,654,466 B1 | 2/2014 | McFadyen |
| 8,654,467 B1 | 2/2014 | Wong et al. |
| 8,665,546 B1 | 3/2014 | Zhao et al. |
| 8,665,551 B1 | 3/2014 | Rigney et al. |
| 8,670,206 B1 | 3/2014 | Liang et al. |
| 8,687,312 B1 | 4/2014 | Liang |
| 8,693,123 B1 | 4/2014 | Guo et al. |
| 8,693,134 B1 | 4/2014 | Xi et al. |
| 8,699,173 B1 | 4/2014 | Kang et al. |
| 8,711,027 B1 | 4/2014 | Bennett |
| 8,717,696 B1 | 5/2014 | Ryan et al. |
| 8,717,699 B1 | 5/2014 | Ferris |
| 8,717,704 B1 | 5/2014 | Yu et al. |
| 8,724,245 B1 | 5/2014 | Smith et al. |
| 8,724,253 B1 | 5/2014 | Liang et al. |
| 8,724,524 B2 | 5/2014 | Urabe et al. |
| 8,737,008 B1 | 5/2014 | Watanabe et al. |
| 8,737,013 B2 | 5/2014 | Zhou et al. |
| 8,743,495 B1 | 6/2014 | Chen et al. |
| 8,743,503 B1 | 6/2014 | Tang et al. |
| 8,743,504 B1 | 6/2014 | Bryant et al. |
| 8,749,904 B1 | 6/2014 | Liang et al. |
| 8,760,796 B1 | 6/2014 | Lou et al. |
| 8,767,332 B1 | 7/2014 | Chahwan et al. |
| 8,767,343 B1 | 7/2014 | Helmick et al. |
| 8,767,354 B1 | 7/2014 | Ferris et al. |
| 8,773,787 B1 | 7/2014 | Beker |
| 8,779,574 B1 | 7/2014 | Agness et al. |
| 8,780,473 B1 | 7/2014 | Zhao et al. |
| 8,780,477 B1 | 7/2014 | Guo et al. |
| 8,780,479 B1 | 7/2014 | Helmick et al. |
| 8,780,489 B1 | 7/2014 | Gayaka et al. |
| 8,792,202 B1 | 7/2014 | Wan et al. |
| 8,797,664 B1 | 8/2014 | Guo et al. |

(56) References Cited

U.S. PATENT DOCUMENTS

| | | |
|---|---|---|
| 8,804,267 B2 | 8/2014 | Huang et al. |
| 8,824,081 B1 | 9/2014 | Guo et al. |
| 8,824,262 B1 | 9/2014 | Liu et al. |
| 2003/0227306 A1 | 12/2003 | Di Iorio |
| 2010/0035085 A1 | 2/2010 | Jung et al. |
| 2010/0053796 A1 | 3/2010 | Boyle et al. |
| 2010/0107016 A1 | 4/2010 | Colman et al. |
| 2012/0284493 A1 | 11/2012 | Lou et al. |
| 2013/0120870 A1 | 5/2013 | Zhou et al. |
| 2013/0148240 A1 | 6/2013 | Ferris et al. |

DATA STORAGE DEVICE EMPLOYING GLITCH COMPENSATION FOR POWER LOSS DETECTION

CROSS-REFERENCE TO RELATED APPLICATION(S)

This application is a continuation-in-part of co-pending U.S. patent application Ser. No. 14/260,426, filed on Apr. 24, 2014, which claims priority to provisional U.S. Patent Application Ser. No. 61/968,841, filed on Mar. 21, 2014, the disclosures of which are incorporated herein by reference in their entirety.

BACKGROUND

Data storage devices, such as disk drives and solid state drives are employed in numerous areas such as computer systems (e.g., desktops, laptops, portables, etc.) and consumer devices (e.g., music players, cell phones, cameras, etc.). User data is typically stored in a non-volatile memory, such as a magnetic disk or a non-volatile semiconductor memory (e.g., Flash memory). When a power loss event occurs, the data storage device may execute an emergency operation such as flushing write data stored in a write cache to the non-volatile memory to avoid data loss, or parking a head on a ramp to avoid damaging the head.

DETAILED DESCRIPTION

Figure 1A:
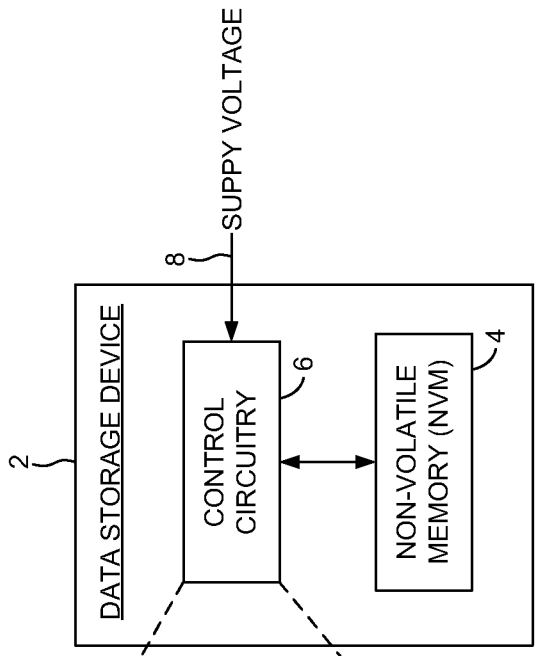
FIG. 1A shows a data storage device according to an embodiment comprising a non-volatile memory powered by a supply voltage.
Figure 1B:
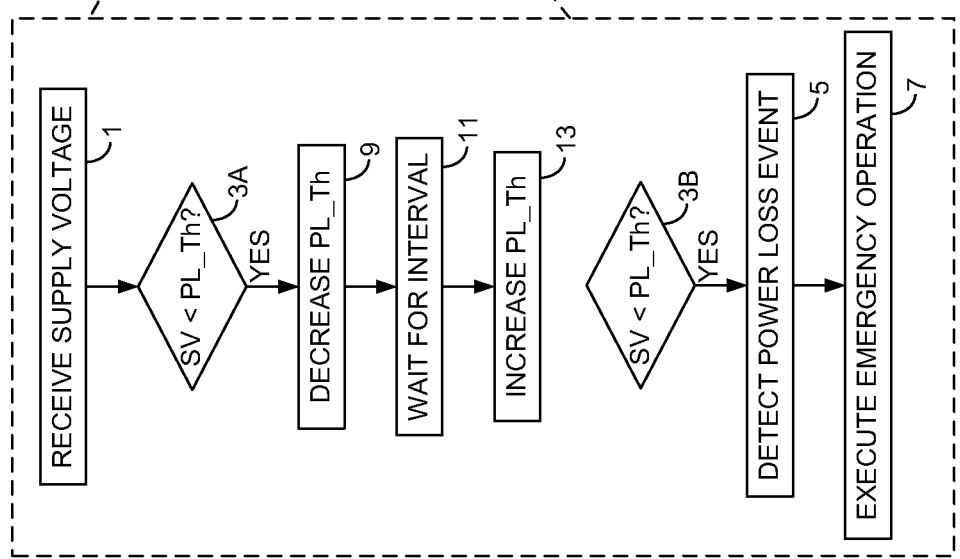
FIG. 1B is a flow diagram according to an embodiment wherein when the supply voltage falls below a power loss threshold, a power loss event is detected, an emergency operation is executed, the power loss threshold is decreased, and after an interval the power loss threshold is increased.

FIG. 1A shows a data storage device 2 according to an embodiment comprising a non-volatile memory 4, and control circuitry 6 configured to execute the flow diagram of FIG. 1B. A supply voltage 8 for powering the non-volatile memory 4 is received (block 1), and the supply voltage 8 is compared to a power loss threshold. When the supply voltage falls below the power loss threshold (block 3B), a power loss event is detected (block 5) and an emergency operation (block 7). Also when the supply voltage falls below the power loss threshold (block 3A), the power loss threshold is decreased (block 9), and after an interval (block 11), the power loss threshold is increased (block 13).

Figure 1C:
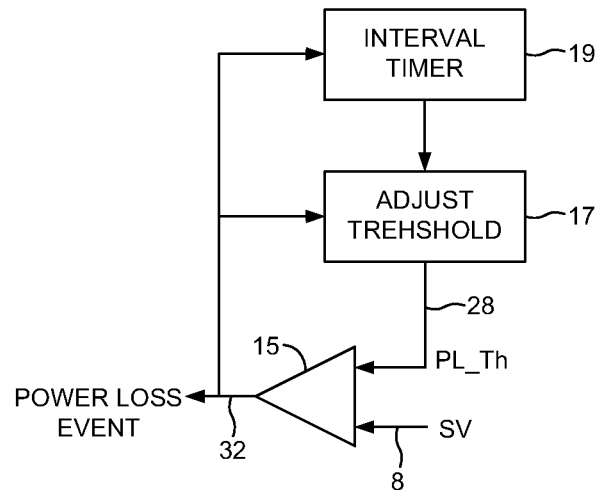
FIG. 1C shows control circuitry according to an embodiment wherein the supply voltage is monitored in the analog domain.
Figure 1D:
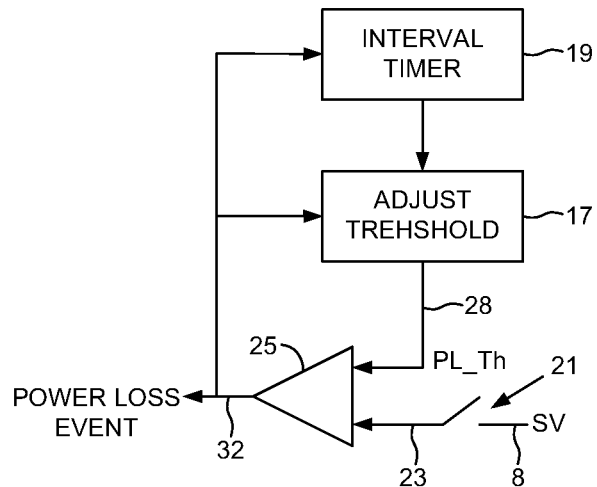
FIG. 1D shows control circuitry according to an embodiment wherein the supply voltage is monitored in the digital domain.

FIG. 1C shows control circuitry according to an embodiment wherein the supply voltage 8 is compared to the power loss threshold 28 in the analog domain using an analog comparator 15. When the supply voltage 8 falls below the power loss threshold 28, block 17 decreases the power loss threshold 28 and an interval timer is reset at block 19. When the interval expires, block 17 increases the power loss threshold 38. FIG. 1D shows control circuitry according to an embodiment wherein the supply voltage 8 is sampled 21, and the supply voltage samples 23 compared to the power loss threshold 28 in the digital domain using a digital comparator 25. In one embodiment, the control circuitry is further configured to detect the power loss event 32 when at least two consecutive supply voltage samples 23 is less than the power loss threshold 28. In yet other embodiments, the supply voltage 8 and/or supply voltage samples 23 may be filtered (e.g., low pass filtered) before being compared to the power loss threshold 28.

Figure 1E:
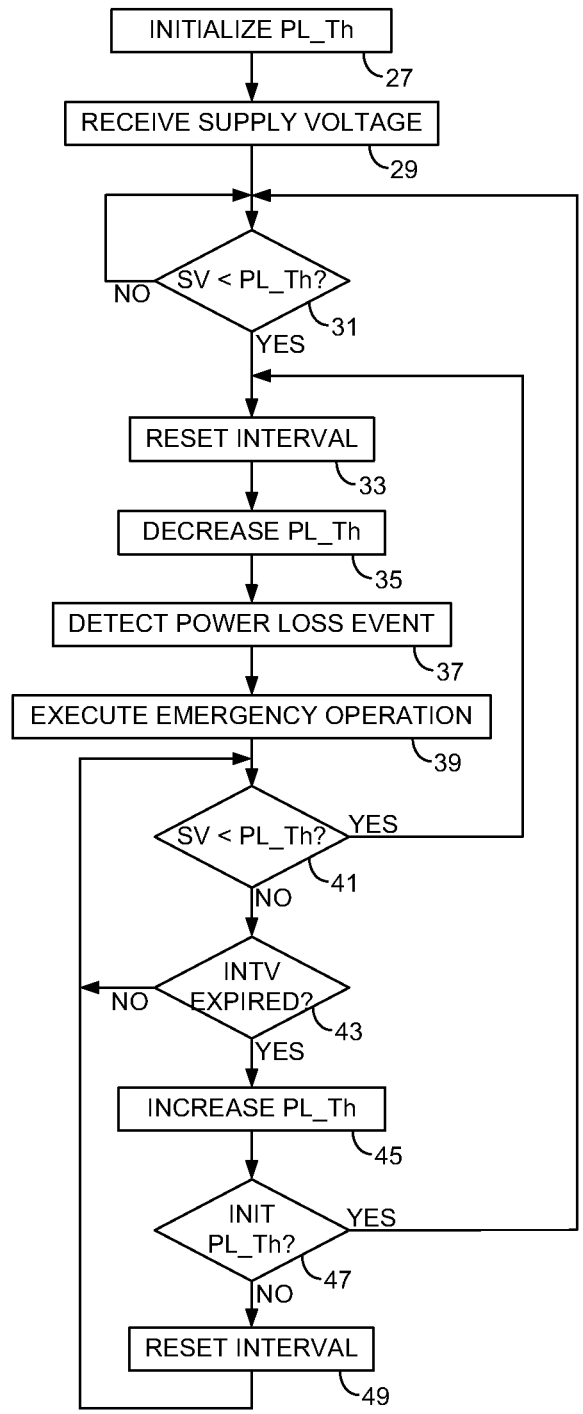
FIG. 1E is a flow diagram according to an embodiment wherein the power loss threshold is decreased and the interval for increasing the power loss threshold is reset each time a power loss event is detected.

FIG. 1E shows a flow diagram according to an embodiment wherein the power loss threshold is initialized to a nominal value (block 27), and the supply voltage is received (block 29) and compared to the power loss threshold (block 31). When the supply voltage falls below the power loss threshold (block 31), an interval is reset (block 33), the power loss threshold is decreased (block 35), a power loss event is detected (block 37), and an emergency operation is executed (block 39). The supply voltage is compared to the adjusted power loss threshold (block 41), and if the supply voltage falls below the adjusted power loss threshold, the flow diagram is repeated from block 33 by resetting the interval and decreasing (again) the power loss threshold. If the supply voltage remains above the power loss threshold (block 41), and the interval expires (block 43), the power loss threshold is increased (block 45). If at block 47 the increased power loss threshold equals the initial power loss threshold set at block 27, then the flow diagram repeats starting at block 31, otherwise the interval is reset (block 49) and the flow diagram repeats starting at block 41.

Figure 1F:
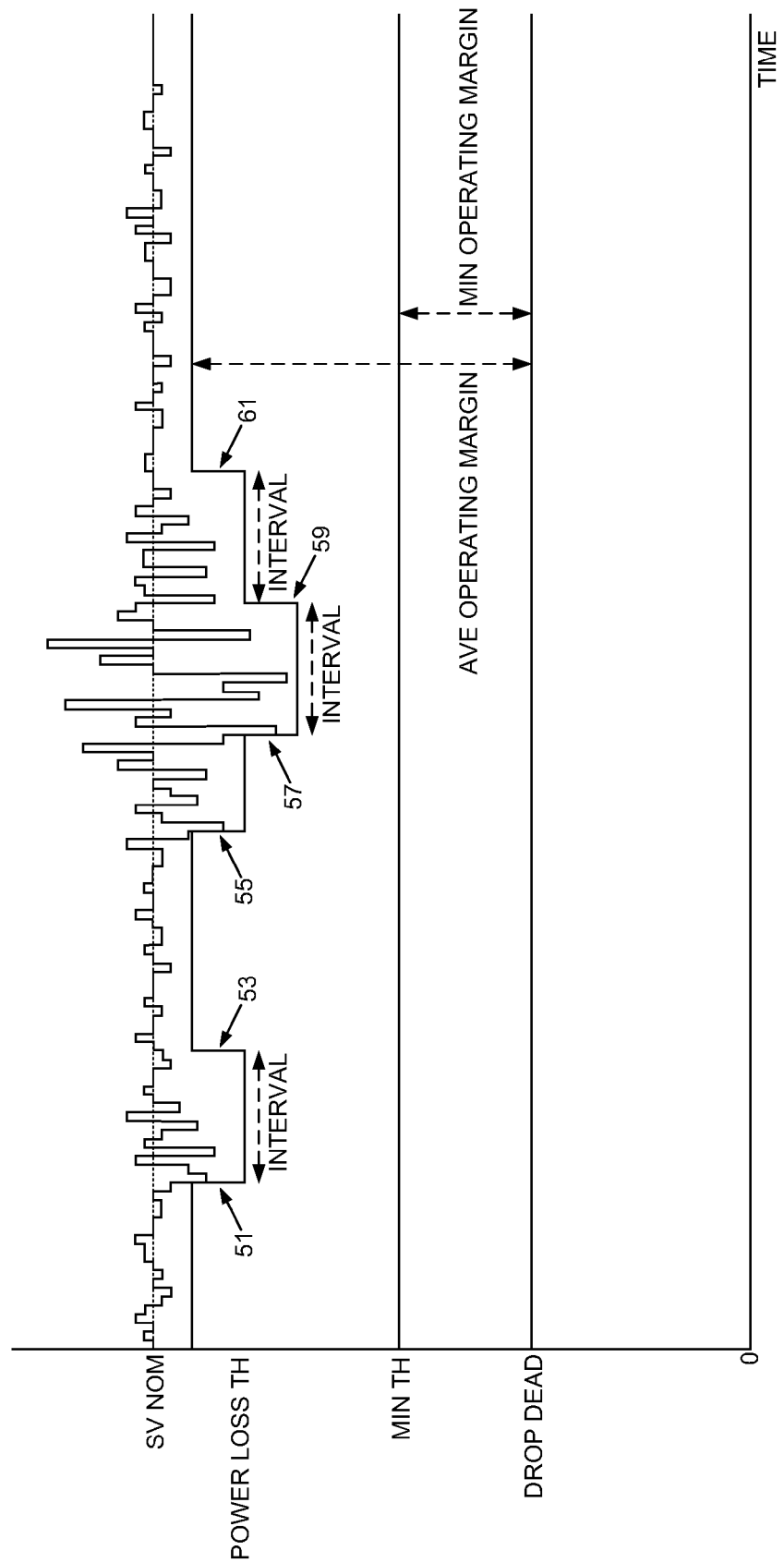
FIG. 1F illustrates an example embodiment wherein the power loss threshold is decreased when a power loss event is detected.

FIG. 1F is a timing diagram illustrating an example embodiment wherein when the supply voltage falls below the power loss threshold at time 51, a power loss event is detected and the power loss threshold is decreased. Because the supply voltage remains above the power loss threshold for an interval, the power loss threshold is increased at time 53. In this embodiment, decreasing the power loss threshold when a power loss event is detected helps reduce the number of false power loss events detected (i.e., glitch compensation). In the example embodiment of FIG. 1F, the power loss threshold may be reduced to a minimum value wherein there is a minimum operating margin of time to perform the emergency operation before the supply voltage reaches the "drop dead" level. Accordingly, when the power loss threshold is decreased, it decreases the operating margin and corresponding time to execute the emergency operation; however, fewer false power loss events are detected and on average the operating margin is maximized as illustrated in FIG. 1F.

Figure 1G:
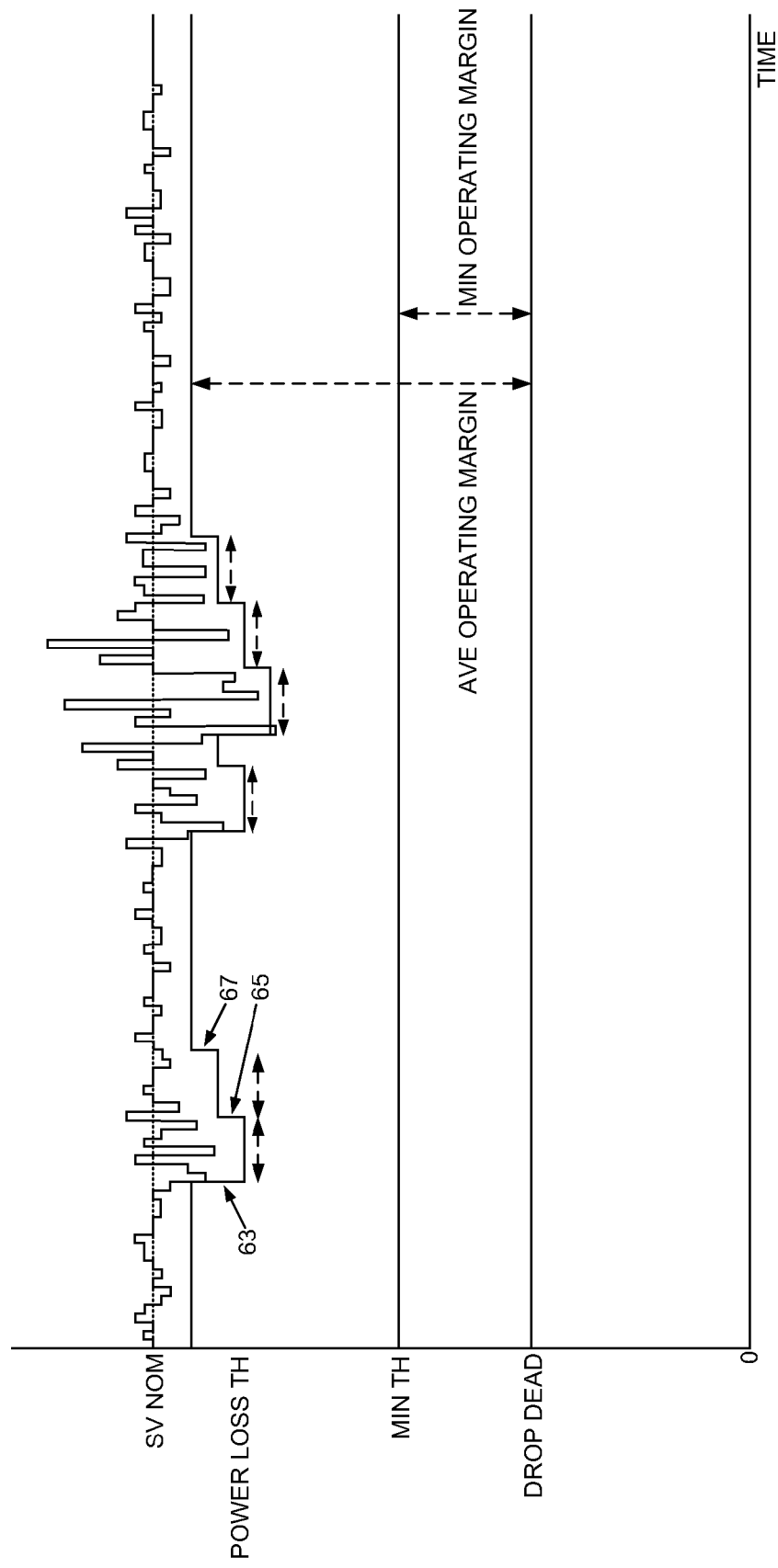
FIG. 1G illustrates an example embodiment wherein after decreasing the power loss threshold the control circuitry increases the power loss threshold in step increments over multiple intervals.

FIG. 1F also illustrates an example wherein a first power loss event is detected at time 55, and then a second power loss event is detected at time 57 before the interval expires. Accordingly in this example the power loss threshold is decreased twice in step increments. After a first interval expires, the power loss threshold is increased at time 59, and after another interval expires, the power loss threshold is increased again at time 61 to the initial nominal level. FIG. 1G illustrates another example embodiment wherein after decreasing the power loss threshold at time 63, the power loss threshold is increased in step increments over multiple intervals (two intervals in this example at times 65 and 67).

Figure 1H:
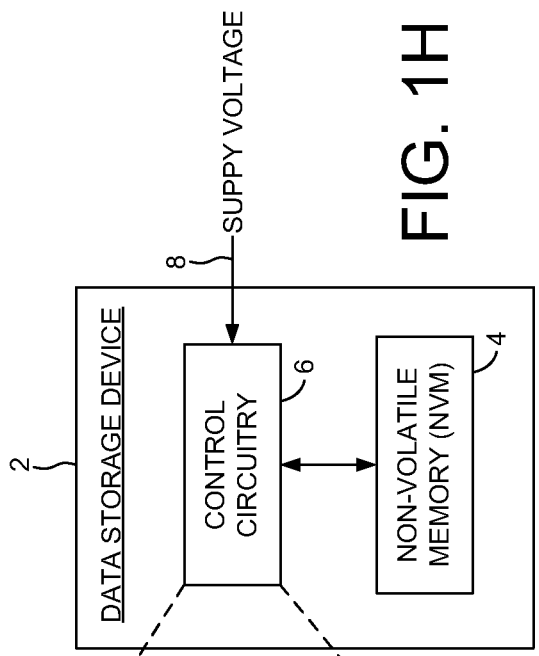
FIG. 1H shows a data storage device according to an embodiment comprising a non-volatile memory powered by a supply voltage.
Figure 1I:
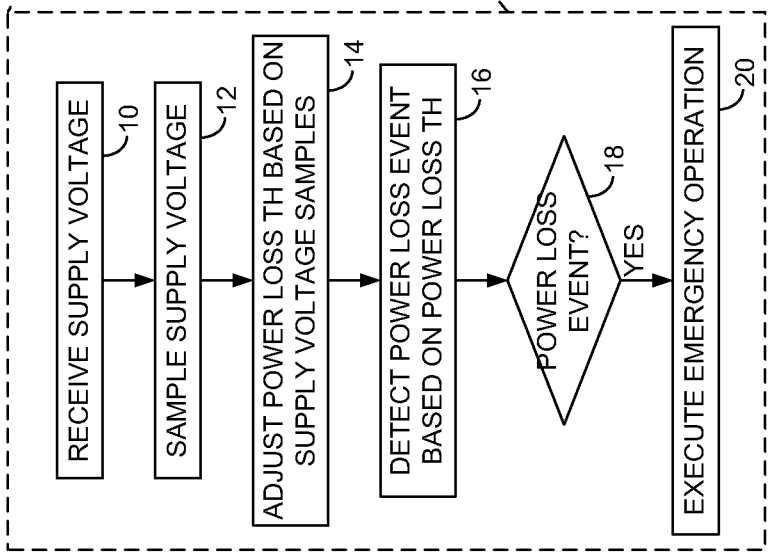
FIG. 1I is a flow diagram according to an embodiment wherein the supply voltage is sampled, and a power loss threshold is adjusted based on the supply voltage samples.

FIG. 1H shows a data storage device 2 according to an embodiment comprising a non-volatile memory 4 and control circuitry 6 configured to execute the flow diagram of FIG. 1I. A supply voltage 8 for powering the non-volatile memory is received (block 10) and sampled to generate supply voltage samples (block 12). A power loss threshold is adjusted based on the supply voltage samples (block 14), and a power loss event is detected based on the power loss threshold and the supply voltage (block 16), wherein when the power loss event is detected (block 18) an emergency operation is executed (block 20).

Figure 6A:
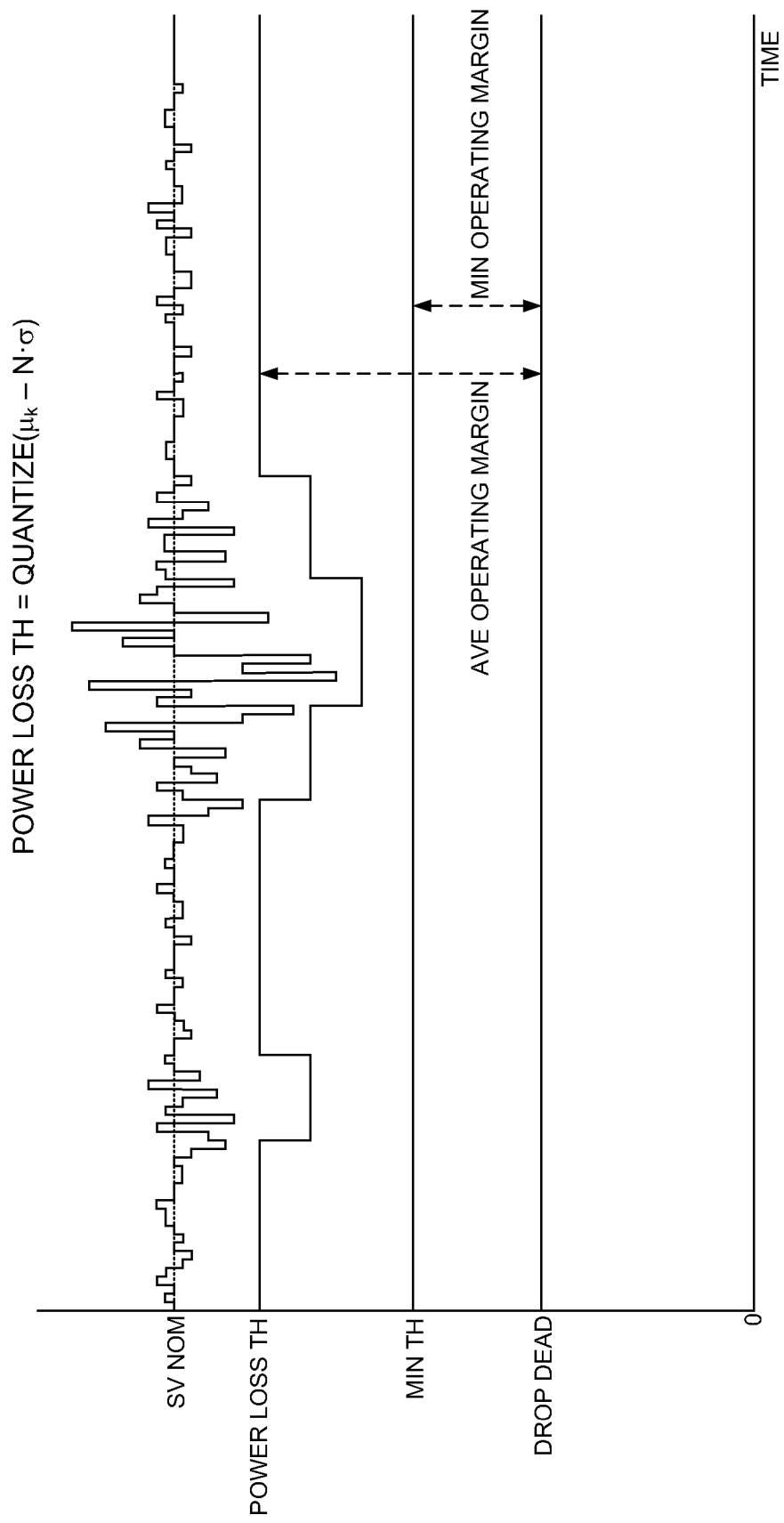
FIG. 6A shows an embodiment wherein the power loss threshold is adjusted based on an average and standard deviation of the supply voltage samples.

In one embodiment, when a power loss event is detected the data storage device may continue to function normally until the supply voltage falls below a "drop dead" threshold. Accordingly, there is an operating margin of supply voltage as measured from the power loss threshold to the drop dead threshold as illustrated in FIG. 6A. During the interval where the supply voltage is falling through this operating margin toward the drop dead threshold, the data storage device may perform an emergency operation such as flushing a write cache before parking a head in a disk drive or flushing a write cache in a solid state drive. Accordingly, in one embodiment adjusting the power loss threshold based on the samples of the supply voltage increases the average operating margin of the supply voltage, thereby improving the performance of the data storage device on average while ensuring a safe power-down operation during periods when the operating margin is decreased.

Figure 2:
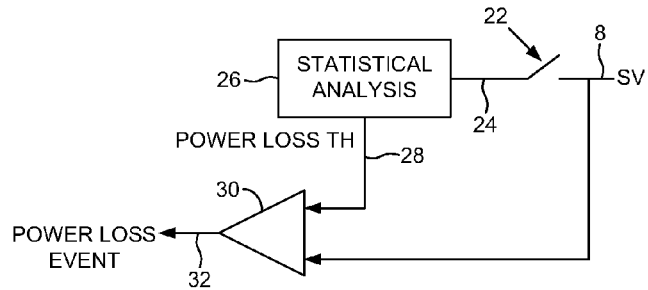
FIG. 2 shows control circuitry according to an embodiment wherein an analog comparator compares the supply voltage to the power loss threshold.

The supply voltage 8 may be processed relative to the power loss threshold in any suitable manner. FIG. 2 shows control circuitry according to an embodiment wherein a suitable sampling device 22 (e.g., an analog-to-digital converter) samples the supply voltage 8 to generate supply voltage samples 24. Block 26 processes the supply voltage samples 24 to adjust a power loss threshold 28 which is compared to the supply voltage 8 at analog comparator 30. In this embodiment, a power loss event 32 is detected when the supply voltage 8 falls below the power loss threshold 28. In another embodiment, the supply voltage 8 may be filtered using a suitable analog filter (e.g., a low-pass filter) in order to attenuate high frequency noise, wherein the filtered supply voltage is compared to the power loss threshold 28 at comparator 30.

Figure 3:
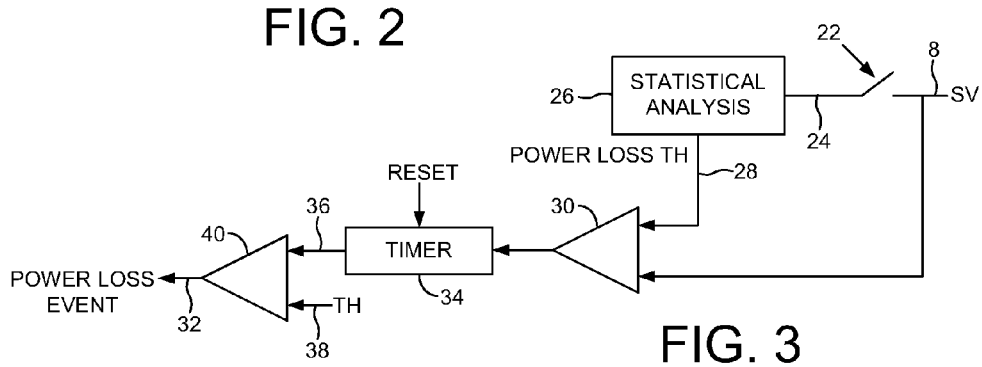
FIG. 3 shows control circuitry according to an embodiment wherein a power loss event is detected when the supply voltage falls below the power loss threshold for a predetermined interval.

FIG. 3 shows control circuitry according to another embodiment wherein the output of the analog comparator 30 enables a timer 34 when the supply voltage 8 falls below the power loss threshold 28. A power loss event 32 is detected when the output 36 of the timer 34 exceeds a threshold 38 at comparator 40. In this embodiment, the supply voltage 8 must remain below the power loss threshold 38 for an interval determined by the threshold 38 before a power loss event 32 is detected. This embodiment has a similar effect as filtering the supply voltage 8 with a low pass filter, and in one embodiment both a low pass filter and a timer may be employed to reduce the number of false power loss events detected.

Figure 4:
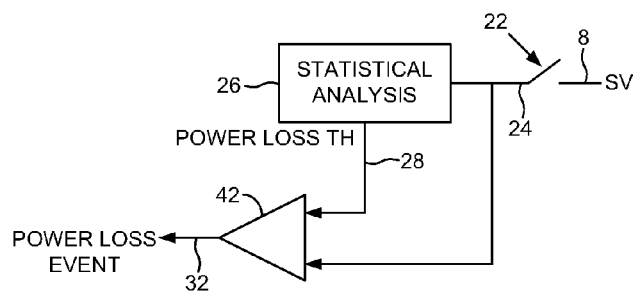
FIG. 4 shows control circuitry according to an embodiment wherein a digital comparator compares the supply voltage samples to the power loss threshold.

FIG. 4 shows control circuitry according to an embodiment wherein a power loss event 32 is detected when one of the supply voltage samples 24 falls below the power loss threshold 28 at digital comparator 42. In one embodiment, the supply voltage samples 24 may be filtered using any suitable digital filter (e.g., a low-pass filter) and the filtered supply voltage samples compared to the power loss threshold 28 at the digital comparator 42.

Figure 5:
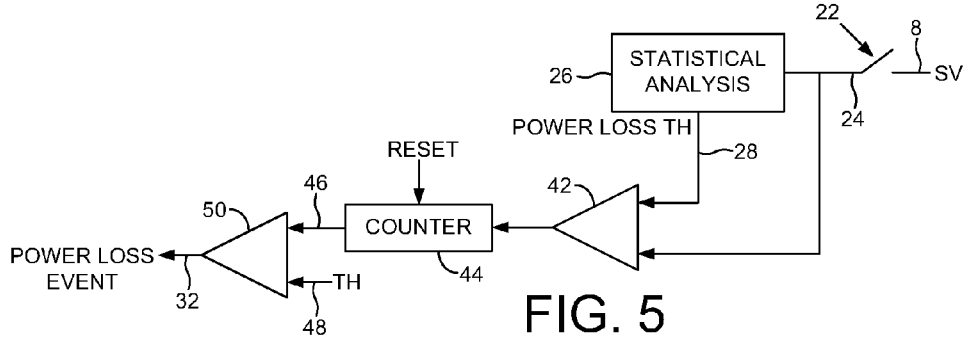
FIG. 5 shows control circuitry according to an embodiment wherein a power loss event is detected when a predetermined number of consecutive supply voltage samples fall below the power loss threshold.

FIG. 5 shows control circuitry according to an embodiment wherein the output of the digital comparator 42 enables a timer 44 when the supply voltage samples 24 fall below the power loss threshold 28. A power loss event 32 is detected when the output 46 of the timer 44 exceeds a threshold 48 at comparator 50. In this embodiment, at least two consecutive supply voltage samples 24 must remain below the power loss threshold 38 (as determined by threshold 48) before a power loss event 32 is detected. This embodiment has a similar effect as filtering the supply voltage samples 24 with a low pass filter, and in one embodiment both a low pass filter and a timer may be employed to reduce the number of false power loss events detected.

The power loss threshold may be adjusted in any suitable manner based on the supply voltage samples. FIG. 6A shows an embodiment wherein the power loss threshold is adjusted by computing the average $u_k$ of the supply voltage samples and then subtracting N times the standard deviation a of the supply voltage samples. In one embodiment, the average $u_k$ and the standard deviation a may be computed over a moving window of the supply voltage samples. As illustrated in the example of FIG. 6A, the power loss threshold is decreased as the noise in the supply voltage increases, and then the power loss threshold is increased as the noise in the supply voltage decreases. This embodiment reduces the likelihood that noise and/or transients in the supply voltage samples will trigger a false power loss event while ensuring true power loss events are still detected. FIG. 6A illustrates how adjusting the power loss threshold based on the level of noise/transients in the supply voltage samples increases the average operating margin of the supply voltage, thereby increasing the average interval available during a power loss event to execute the emergency operation. During periods of high supply voltage noise/transients, the operating margin decreases with a corresponding decrease in the interval available to execute the emergency operation. As described in greater detail below, in one embodiment the data storage device may be configured into different operating modes based on the level of the power loss threshold and the corresponding interval available to execute the emergency operation during a power loss event.

In the embodiment of FIG. 6A, the control circuitry 6 adjusts the power loss threshold in quantized steps, such as in steps of at least ten millivolts, in order to maintain a sufficient margin between the power loss threshold and the supply voltage, thereby avoiding a decrease in performance due to detecting false power loss events. The power loss threshold may be decreased down to the minimum threshold shown in FIG. 6A which corresponds to a minimum operating margin for the supply voltage and a corresponding minimum interval to execute the emergency operation before the supply voltage drops to the drop dead threshold.

Figure 6B:
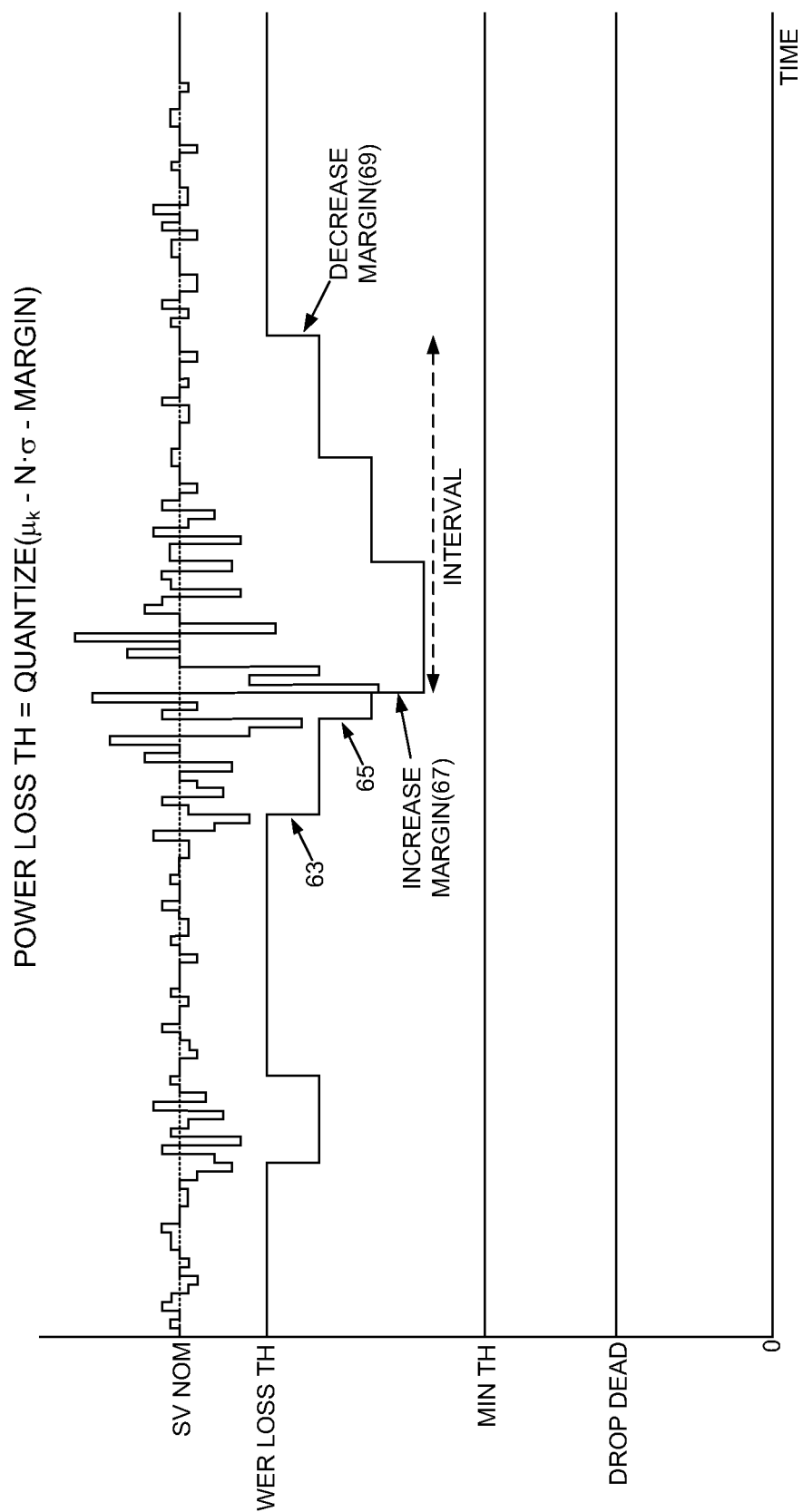
FIG. 6B shows an embodiment wherein the power loss threshold is adjusted based on an average and standard deviation of the supply voltage samples as well as a margin that is increased when a power loss event is detected.

FIG. 6B illustrates an embodiment wherein the power loss threshold is adjusted based both on the average and standard deviation of the supply voltage samples similar to the example embodiment of FIG. 6A, as well as by a margin which corresponds to the decrease in the supply voltage when a power loss event is detected as described above with reference to FIG. 1F. For example, the power loss threshold may be decreased at time 63 and time 65 based on the mean and standard deviation of the supply voltage samples changing, and then the margin may be increased at time 67 due to a power loss event being detected, thereby further decreasing the power loss threshold. In the example of FIG. 6B, the interval for increasing the power supply voltage (by decreasing the margin at time 69) is longer than the interval in the example embodiment shown in FIG. 1F. That is, in one embodiment the power loss threshold may be adjusted at a higher frequency based on the mean and standard deviation of the supply voltage samples as compared to the adjustment frequency of the margin when power loss events are detected. In one embodiment, the length of a moving window for computing the average and standard deviation of the supply voltage samples may be programmable and/or the interval length for adjusting the margin may be programmable. For example, in one embodiment the length of the moving window and/or the interval length for adjusting the margin may be adapted over time based on the frequency of detected power loss events (and/or the frequency of false triggers).

Figure 7A:
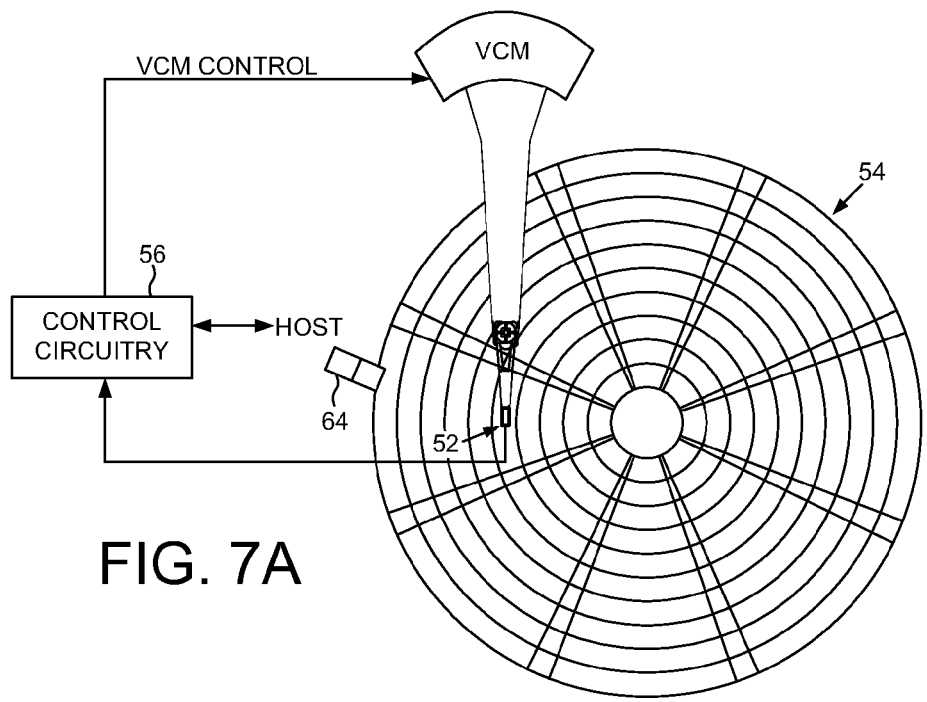
FIG. 7A shows a data storage device in the form of a disk drive according to an embodiment.
Figure 7B:
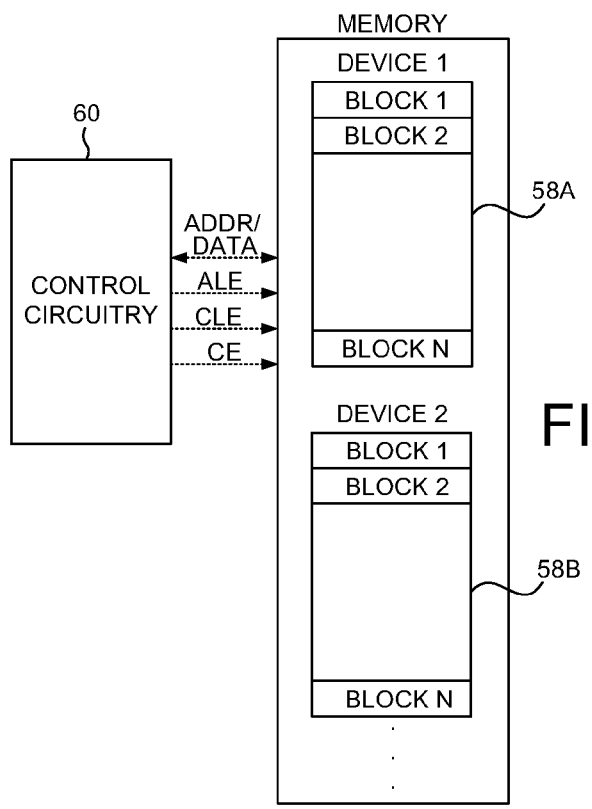
FIG. 7B shows a data storage device in the form of a solid state drive according to an embodiment.
Figure 7C:
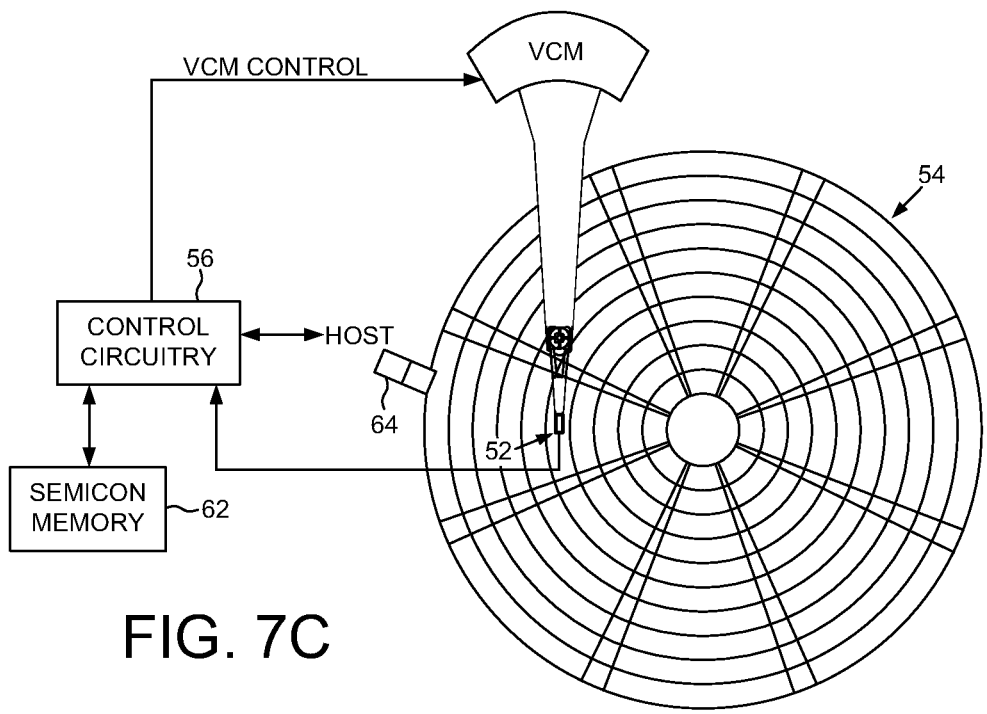
FIG. 7C shows a data storage device in the form of a hybrid drive according to an embodiment.

The embodiments of the present invention may be employed in any suitable data storage device 2 comprising any suitable non-volatile memory. FIG. 7A shows a data storage device comprising a disk drive including a head 52 actuated over a disk 54 and control circuitry 56. FIG. 7B shows a data storage device comprising a solid state drive including a plurality of non-volatile semiconductor memories 58A, 58B, etc., such as flash memories, and control circuitry 60. FIG. 7C shows a data storage device comprising a hybrid drive comprising components of a disk drive shown in FIG. 7A combined with the non-volatile semiconductor memory 62 such as shown in FIG. 7B. In an embodiment described below, the non-volatile semiconductor memory 62 may be used to flush at least part of a write cache when a power loss event is detected.

Figure 8:
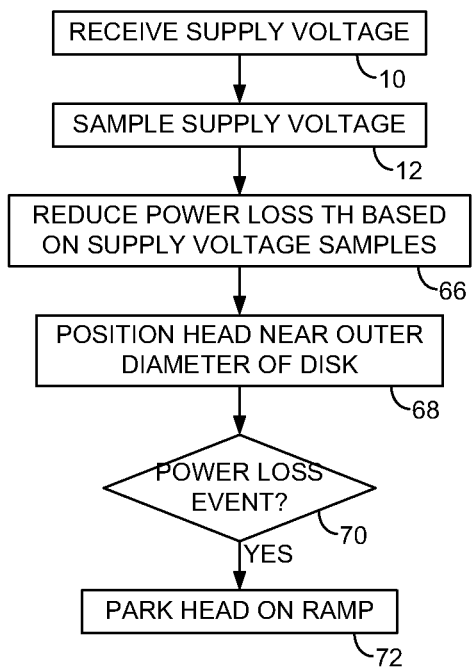
FIG. 8 is a flow diagram according to an embodiment wherein the control circuitry of a disk drive positions a head near an outer diameter of a disk based on the power loss threshold.

In one embodiment the data storage device may be configured into different operating modes based on the level of the power loss threshold and the corresponding interval available to execute the emergency operation during a power loss event. For example, in one embodiment the data storage device may comprise a disk drive such as shown in FIG. 7A, wherein the control circuitry 56 may configure the disk drive into different operating modes relative to the time needed to park the head 52 onto a ramp 64 during a power loss event. An example of this embodiment is illustrated in the flow diagram of FIG. 8 wherein when the power loss threshold is reduced based on the supply voltage samples (block 66), the head 52 is positioned near an outer diameter of the disk 54. When configured into this mode, the control circuitry 56 may deny or constrain access to the disk 54, such as by denying or constraining host commands, and/or by servicing host commands (when possible) by reading from a non-volatile semiconductor memory 62 such as shown in FIG. 7C or by caching write data in a write cache located in the non-volatile semiconductor memory 62 or near an outer diameter of the disk. Constraining the head 52 to an outer band of the disk 54 reduces the seek time and power needed to park the head 52 onto the ramp 64 at block 72 when a power loss event is detected at block 70.

Figure 9:
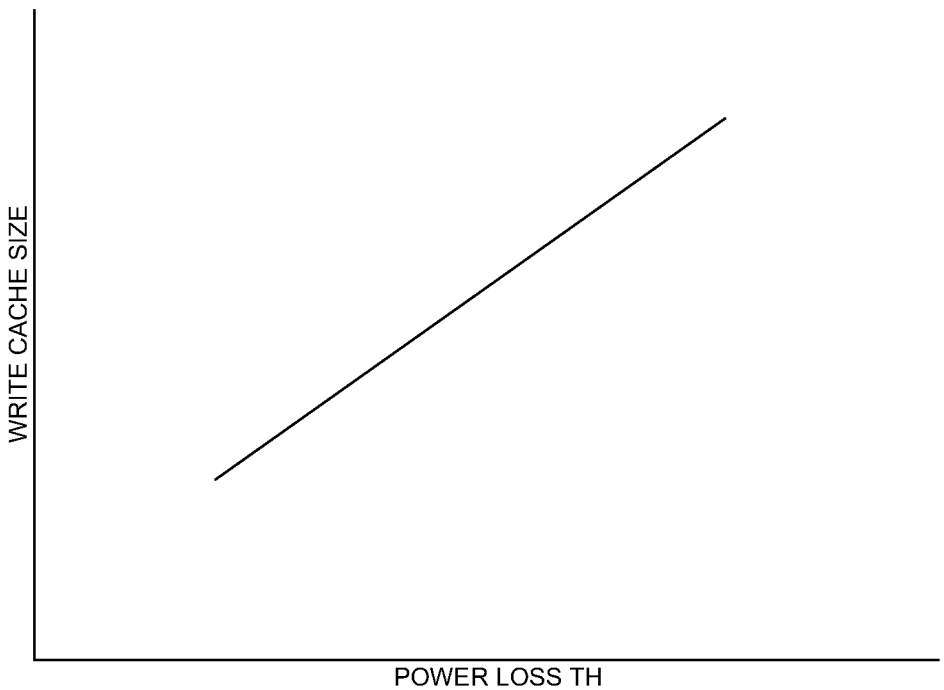
FIG. 9 shows an embodiment wherein a size of a write cache is adjusted based on the power supply threshold.

In one embodiment the data storage device may comprise a write cache for caching write data received from a host in connection with executing write commands. The write cache may improve performance of the data storage device by temporarily storing write data in a volatile semiconductor memory (e.g., DRAM), thereby enabling the host to transmit a stream of write data uninterrupted by the latency of the non-volatile memory 4. The data storage device may then flush the write data from the write cache to the non-volatile memory as a background task, such as during an idle time. The data storage device may also flush the write cache to the non-volatile memory 4 as part of the emergency operation executed when a power loss event is detected so that the write data is not lost. FIG. 9 illustrates an embodiment wherein the size of the write cache may be adjusted based on the power loss threshold. For example, as the power loss threshold is decreased thereby decreasing the interval available during a power loss event, the size of the write cache may be decreased. The smaller write cache helps ensure the entire write cache may be flushed to the non-volatile memory 4 during a power loss event. As the power loss threshold is increased, the size of the write cache may be increased in order increase the performance of the data storage device. Although FIG. 9 shows a linear relationship of write cache size relative to the power loss threshold, the relationship may be represented using any suitable function, such as a suitable polynomial.

Figure 10:
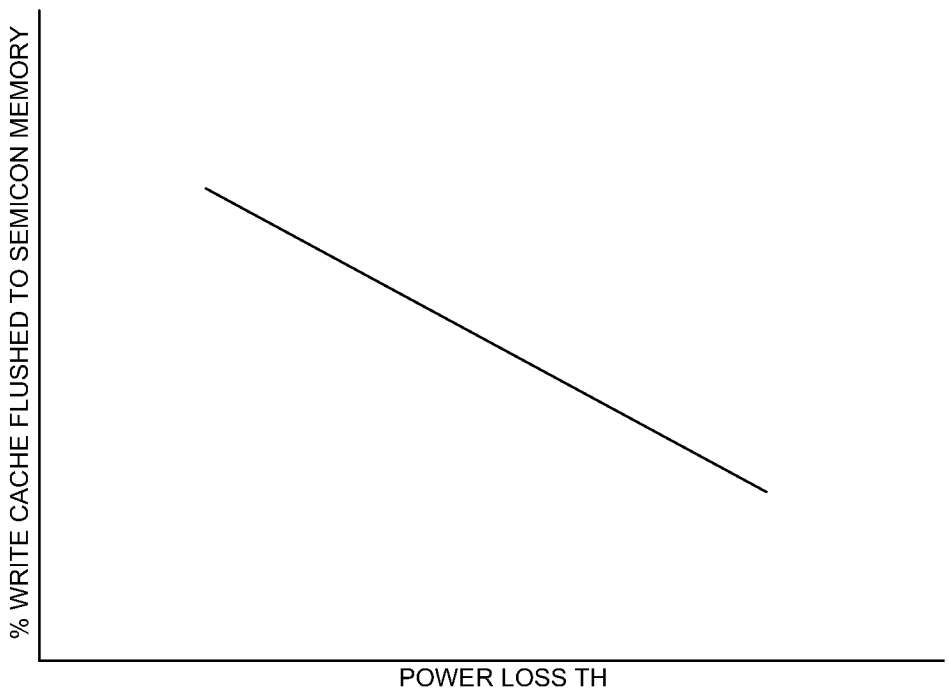
FIG. 10 shows an embodiment wherein a percentage of write cache data that is flushed to a non-volatile semiconductor memory is based on the power loss threshold.

FIG. 10 illustrates an embodiment wherein the data storage device comprising a hybrid drive such as shown in FIG. 7C, and a percentage of write cache data that is flushed to a non-volatile semiconductor memory 62 during a power loss event is based on the power loss threshold. For example, as the power loss threshold is decreased the percentage of the write cache data flushed to the non-volatile semiconductor memory 62 is increased since the access latency of the non-volatile semiconductor memory 62 is typically less than the access latency of the disk 54. Although FIG. 10 shows a linear relationship, the relationship may be represented using any suitable function, such as a suitable polynomial. In one embodiment, the control circuitry 56 may compute an execution time needed to flush the write cache data to either the disk 54 or the non-volatile semiconductor memory 62, and then allocate the percentage of write cache data to each non-volatile memory based on the power loss threshold and the corresponding interval available to flush the write cache during a power loss event.

Any suitable control circuitry may be employed in the embodiments of the present invention, such as one or more integrated circuits. In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored in a non-volatile memory and read into a volatile semiconductor memory when the data storage device is powered on. In yet another embodiment, the control circuitry comprises suitable logic circuitry, such as state machine circuitry.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-volatile memory; and
control circuitry configured to:
receive a supply voltage for powering the non-volatile memory;
compare the supply voltage to a power loss threshold;
when the supply voltage falls below the power loss threshold:
detect a power loss event and execute an emergency operation; and
decrease the power loss threshold, and after an interval increase the power loss threshold.

2. The data storage device as recited in claim 1, wherein after decreasing the power loss threshold the control circuitry is further configured to increase the power loss threshold in step increments over multiple intervals.

3. The data storage device as recited in claim 1, wherein the control circuitry is further configured to detect the power loss event when the supply voltage falls below the power loss threshold in an analog domain.

4. The data storage device as recited in claim 1, wherein the control circuitry is further configured to:
sample the supply voltage to generate supply voltage samples; and
detect the power loss event when at least one of the supply voltage samples is less than the power loss threshold in a digital domain.

5. The data storage device as recited in claim 4, wherein the control circuitry is further configured to detect the power loss event when at least two consecutive supply voltage samples is less than the power loss threshold.

6. The data storage device as recited in claim 1, wherein the control circuitry is further configured to:
sample the supply voltage to generate supply voltage samples; and
adjust the power loss threshold based on an average of the supply voltage samples.

7. The data storage device as recited in claim 6, wherein the control circuitry is further configured to adjust the power loss threshold based on a standard deviation of the supply voltage samples.

8. The data storage device as recited in claim 6, wherein the control circuitry is further configured to adjust the power loss threshold by subtracting a standard deviation of the supply voltage samples from the average of the supply voltage samples.

9. The data storage device as recited in claim 1, wherein the non-volatile memory comprises a head actuated over a disk.

10. The data storage device as recited in claim 1, wherein the non-volatile memory comprises a semiconductor memory.

11. A method of operating a data storage device comprising, the method comprising:
receiving a supply voltage for powering a non-volatile memory;
comparing the supply voltage to a power loss threshold;
when the supply voltage falls below the power loss threshold:
detecting a power loss event and execute an emergency operation; and
decreasing the power loss threshold, and after an interval increase the power loss threshold.

12. The method as recited in claim 11, wherein after decreasing the power loss threshold the method further comprises increasing the power loss threshold in step increments over multiple intervals.

13. The method as recited in claim 11, further comprising detecting the power loss event when the supply voltage falls below the power loss threshold in an analog domain.

14. The method as recited in claim 11, further comprising:
sampling the supply voltage to generate supply voltage samples; and
detecting the power loss event when at least one of the supply voltage samples is less than the power loss threshold in a digital domain.

15. The method as recited in claim 14, further comprising detecting the power loss event when at least two consecutive supply voltage samples is less than the power loss threshold.

16. The method as recited in claim 11, further comprising:
sampling the supply voltage to generate supply voltage samples; and
adjusting the power loss threshold based on an average of the supply voltage samples.

17. The method as recited in claim 16, further comprising adjusting the power loss threshold based on a standard deviation of the supply voltage samples.

18. The method as recited in claim 16, further comprising adjusting the power loss threshold by subtracting a standard deviation of the supply voltage samples from the average of the supply voltage samples.

19. The method as recited in claim 11, wherein the non-volatile memory comprises a head actuated over a disk.

20. The method as recited in claim 11, wherein the non-volatile memory comprises a semiconductor memory.

* * * * *